United States Patent
He (10) Patent No.: US 12,193,308 B2
(45) Date of Patent: Jan. 7, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Ping He, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 17/598,265

(22) PCT Filed: Aug. 6, 2021

(86) PCT No.: PCT/CN2021/111201
§ 371 (c)(1),
(2) Date: Sep. 25, 2021

(87) PCT Pub. No.: WO2023/010534
PCT Pub. Date: Feb. 9, 2023

(65) Prior Publication Data
US 2024/0057442 A1   Feb. 15, 2024

(30) Foreign Application Priority Data
Aug. 2, 2021  (CN) .......................... 202110879841.4

(51) Int. Cl.
*H10K 59/80* (2023.01)
*H10K 77/10* (2023.01)

(52) U.S. Cl.
CPC ......... *H10K 59/872* (2023.02); *H10K 77/111* (2023.02)

(58) Field of Classification Search
None
See application file for complete search history.

(56) References Cited

U.S. PATENT DOCUMENTS

2015/0108439 A1* 4/2015 Kim ...................... H10K 50/84
257/40
2016/0349561 A1  12/2016 Shiina et al.
(Continued)

FOREIGN PATENT DOCUMENTS

CN  109599402 A  4/2019
CN  110058444 A  7/2019
(Continued)

OTHER PUBLICATIONS

Chinese Office Action issued in corresponding Chinese Patent Application No. 202110879841.4 dated Apr. 2, 2022, pp. 1-8.
(Continued)

*Primary Examiner* — Erik T. K. Peterson
(74) *Attorney, Agent, or Firm* — PV IP PC; Wei Te Chung (57) ABSTRACT

Disclosed are a display panel and a display device. The display panel comprises a first curved area located between two second curved areas and corresponding to a corner of a plane area. The display panel comprises a support layer and a panel main body, and the support layer comprises a curved first part located in the first curved area and a curved second part located in the second curved area; the panel main body is located on the support layer and curved with the first part and the second part. An elastic modulus of the first part is smaller than an elastic modulus of the second part.

14 Claims, 3 Drawing Sheets

(56) References Cited

U.S. PATENT DOCUMENTS

| | | | | |
|---|---|---|---|---|
| 2019/0131362 | A1* | 5/2019 | Lee | H10K 59/87 |
| 2019/0269011 | A1* | 8/2019 | Lee | H05K 3/0014 |
| 2020/0160761 | A1* | 5/2020 | Ahn | H10K 50/841 |
| 2020/0176696 | A1* | 6/2020 | Dai | H10K 59/131 |
| 2021/0013434 | A1* | 1/2021 | Cao | H10K 59/12 |
| 2021/0057669 | A1 | 2/2021 | Choi et al. | |
| 2021/0309304 | A1* | 10/2021 | Mueller | B29C 45/0055 |
| 2022/0085305 | A1* | 3/2022 | Zhao | H10K 59/131 |
| 2022/0102462 | A1* | 3/2022 | Zhou | H10K 59/121 |
| 2022/0118731 | A1* | 4/2022 | Shin | B32B 3/02 |
| 2022/0246878 | A1* | 8/2022 | Sung | H10K 50/844 |
| 2022/0308625 | A1* | 9/2022 | Gao, Sr. | G06F 1/1628 |

FOREIGN PATENT DOCUMENTS

| | | |
|---|---|---|
| CN | 110164315 A | 8/2019 |
| CN | 111540279 A | 8/2020 |
| CN | 111640775 A | 9/2020 |
| CN | 112002248 A | 11/2020 |
| CN | 112071884 A | 12/2020 |
| CN | 112313142 A | 2/2021 |

OTHER PUBLICATIONS

International Search Report in International application No. PCT/CN2021/111201, mailed on Apr. 25, 2022.
Written Opinion of the International Searching Authority in International application No. PCT/CN2021/111201, mailed on Apr. 25, 2022.

\* cited by examiner

DISPLAY PANEL AND DISPLAY DEVICE

RELATED APPLICATIONS

This application is a Notional Phase of PCT Patent Application No. PCT/CN2021/111201 having international filing date of Aug. 6, 2021, which claims the benefit of priority of Chinese Patent Application No. 202110879841.4 filed on Aug. 2, 2021. The contents of the above applications are all incorporated by reference as if fully set forth herein in their entirety.

FIELD OF THE INVENTION

The present application relates to a display technology field, and more particularly to a display panel and a display device.

BACKGROUND OF THE INVENTION

When the four-curved display module is 3D pasted, in order to avoid fitting wrinkles, the redundant part at the corners of the four-curved display module will be cut off before the 3D pasting of the four-curved display module to ensure that the required shape of the four-curved corners can be formed after the lamination. However, since there will be cutting seams in the corners, it will also affect the user's visual experience of the full-screen display.

SUMMARY OF THE INVENTION

The embodiments of the present application provide a display panel and a display device, which can improve the problem that the display panel has fitting wrinkles in an area with a curved surface.

The embodiment of the present application provides a display panel. The display panel comprises a plane area, a first curved area and two second curved areas, wherein the plane area comprises a first side and a second side adjacent to the first side, and the two second curved areas are respectively adjacent to the first side and the second side, and the first curved area is located between the two second curved areas and corresponds to a corner of the plane area. The display panel comprises a support layer and a panel main body. The support layer comprises a curved first part located in the first curved area and a curved second part located in the second curved area. The panel main body is located on the support layer and curved along with the first part and the second part. An elastic modulus of the first part is smaller than an elastic modulus of the second part.

Optionally, in some embodiments of the present application, the display panel further comprises a transition area located between the first curved area and the second curved area, and the support layer comprises a curved third part located in the transition area; wherein an elastic modulus of the third part is greater than the elastic modulus of the first part and is smaller than the elastic modulus of the second part.

Optionally, in some embodiments of the present application, in a direction from the first curved area to the second curved area, the elastic modulus of the third part gradually increases.

Optionally, in some embodiments of the present application, the first part comprises a first base material, the second part comprises a second base material, and the third part comprises a mixture of the first base material and the second base material; wherein an elastic modulus of the first base material is less than an elastic modulus of the second base material.

Optionally, in some embodiments of the present application, in a direction from the first curved area to the second curved area, a proportion of the second base material gradually increases.

Optionally, in some embodiments of the present application, the first base material comprises polydimethylsiloxane or thermoplastic elastomer; the second base material comprises polyimide or polyethylene terephthalate.

Optionally, in some embodiments of the present application, a stretch rate of the third part is less than a stretch rate of the first part, and is greater than a stretch rate of the second part.

Optionally, in some embodiments of the present application, a maximum stretch rate of the first part is greater than 50%, and a maximum stretch rate of the second part is less than 50%.

Optionally, in some embodiments of the present application, the elastic modulus of the first part is greater than or equal to 1 MPa and less than or equal to 20 MPa, and the elastic modulus of the second part is greater than or equal to 1 GPa and less than or equal to 10 GPa.

Optionally, in some embodiments of the present application, the support layer further comprises a fourth part located in the plane area, and the elastic modulus of the second part is less than or equal to an elastic modulus of the fourth part.

Optionally, in some embodiments of the present application, the display panel further comprises a plane transition area between the first curved area and the plane area, and the support layer further comprises a fifth part located in the plane transition area; wherein an elastic modulus of the fifth part is smaller than the elastic modulus of the fourth part, and is greater than the elastic modulus of the first part.

Optionally, in some embodiments of the present application, the elastic modulus of the fifth part is equal to the elastic modulus of the third part.

Optionally, in some embodiments of the present application, in a direction from the first curved area to the plane area, the elastic modulus of the fifth part gradually increases.

Optionally, in some embodiments of the present application, the panel main body comprises a substrate, a driving array layer and a light emitting device; the substrate is located on the support layer, the driving array layer is located on the substrate, and the light emitting device is located on the driving array layer.

Optionally, in some embodiments of the present application, the light emitting device comprises an organic light emitting diode, a mini light emitting diode or a micro light emitting diode.

The embodiment of the present application further provides a display device. The display device comprises any one of the aforesaid display panels.

In the display panels and display devices provided by the present application, by providing a support layer under the panel main body, and the elastic modulus of the first part in the first curved area of the support layer is smaller than the elastic modulus of the second part in the second curved area, so that the stretchability of the first part is better than the stretchability of the second part. When the display panel is subjected to a is 3D pasting process, the first part can achieve partial tensile deformation, so that the panel main body and the curved cover plate are closely attached to each other, to avoid the problems of fitting wrinkles, fitting bubbles, etc. of the display panel in the first curved area, and to be beneficial for the display panel to realize a narrow-frame full-screen design.

DETAILED DESCRIPTION OF PREFERRED EMBODIMENTS

For the purpose, technical solutions and advantages of the present application will become clear, unambiguous, embodiments of the present application is described in further detail below with reference to the accompanying drawings simultaneously. It should be understood that the specific embodiments described herein are merely for explaining the present application and are not intended to limit the present application.

Figure 1A:
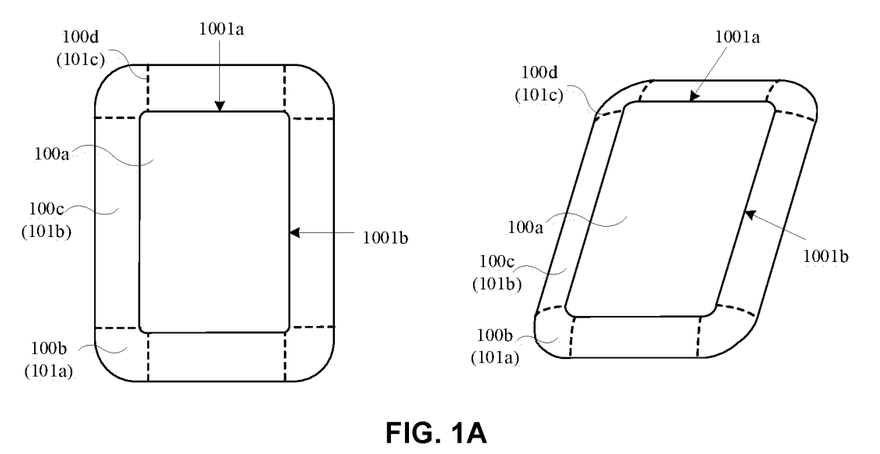
FIG. 1A and FIG. 1B are schematic structural diagrams of a display panel provided by embodiments of the present application.
Figure 1B:
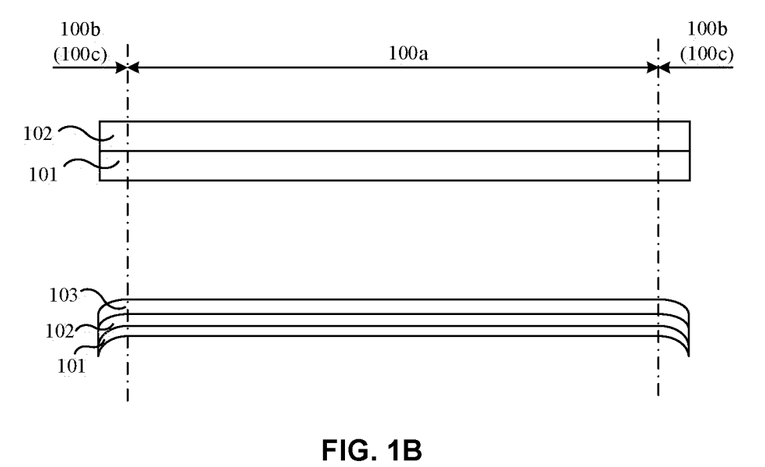

Specifically, FIG. 1A and FIG. 1B are schematic structural diagrams of a display panel provided by embodiments of the present application. The present application provides a display panel. The display panel comprises a plane area 100a, a first curved area 100b and a second curved area 100c.

Optionally, both the first curved area 100b and the second curved area 100c are connected to the plane area 100a; alternatively, the second curved area 100c is connected to the plane area 100a, and the first curved area 100b is only connected to the second curved area 100c.

Specifically, the plane area 100a comprises a first side 1001a and a second side 1001b adjacent to the first side 1001a, and the two second curved areas 100c are respectively connected to the first side 1001a and the second side 1001b, and the first curved area 100b is located between the two second curved areas 100c and corresponds to a corner of the plane area 100a. The first curved area 100b may be connected to the plane area 100a or not connected to the plan area 100a.

Optionally, the display panel may comprise at least two of the second curved areas 100c and at least one of the first curved areas 100b. Further, in a top view, the plane area 100a is rectangular. The display panel may comprise four second curved areas 100c and four first curved areas 100b. The plane area 100a possesses four sides, and each of the second curved areas 100c is respectively connected to one side of the plane area 100a. Each of the first curved areas 100b is located between the two second curved areas 100c and corresponds to one corner of the plane area 100a.

The plane area 100a, the first curved areas 100b and the second curved areas 100c can all implement a display function.

Optionally, the display panel further comprises a sensing area. Moreover, the sensing area is located in the plane area 100a. The sensing area is employed to enable the display panel to achieve a sensing function. The display panel comprises a sensor corresponding to the sensing area. Optionally, the sensor comprises a camera, a light sensor, a distance sensor, a fingerprint recognition sensor and the like.

Please continue to refer to FIG. 1A to FIG. 1B. The plane area 100a of the display panel as a rectangle, and the display panel comprising four second curved areas 100c and four first curved areas 100b are considered as an illustration, the display panel will be described for explanation.

The display panel comprises a support layer 101 and a panel main body 102. The support layer 101 comprises a first part 101a located in the first curved area 100b and a second part 101b located in the second curved area 100c; the panel main body 102 is located on the support layer 101.

The elastic modulus of the first part 101a is smaller than the elastic modulus of the second part 101b, so that the stretchability of the first part 101a is better than the stretchability of the second part 101b. As conducting a 3D pasting process, the first part 101a can be stretched, so that the panel main body 102 in the first curved area 100b and the curved cover plate 103 are closely attached, to avoid the problems of wrinkles, fitting bubbles of the display panel appearing in the first curved area 100b.

The support layer 101 and the panel main body 102 may be in a straight state before the display panel is processed by the 3D pasting process; after the 3D pasting process is accomplished, the first part 101a and the second part 101b are in a curved state. Thus, the panel main body 102 located on the support layer 101 is curved along with the first part 101a and the second part 101b at the parts corresponding to the first curved area 100b and the second curved area 100c, to ensure that the panel main body 102 and the support layer 101 are closely attached to each other. Besides, after conducting the 3D pasting process, the first curved area 100b and the second curved area 100c of the display panel are in a curved state, so that the frame width of the display panel as seeing is smaller and the user's visual experience can be improved, to be beneficial for the display panel to realize a narrow-frame full-screen design.

Figure 2:
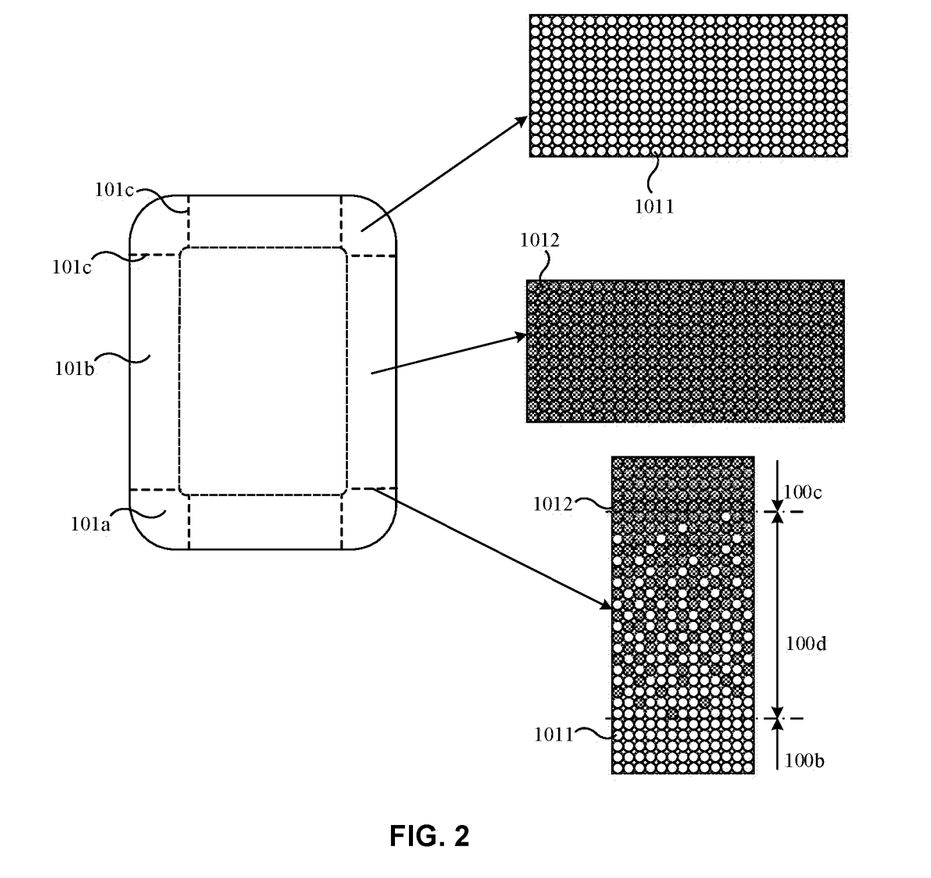
FIG. 2 is a schematic structural diagram of a support layer provided by an embodiment of the present application.

Optionally, different preparation materials may be employed in the parts of the support layer 101 corresponding to the first curved area 100b and the second curved area 100c, so that the elastic modulus of the first part 101a is smaller than the elastic modulus of the second part 101b. Specifically, FIG. 2 is a schematic structural diagram of a support layer provided by an embodiment of the present application. The first part 101a comprises a first base material 1011, the second part 101b comprises a second base material 1012, and an elastic modulus of the first base material 1011 is less than an elastic modulus of the second base material 1012. Optionally, the first base material 1011 comprises polydimethylsiloxane or thermoplastic elastomer; the second base material 1012 comprises polyimide or polyethylene terephthalate.

It can be understood that the elastic modulus of the first part 101a may be determined by factors such as the shape and the degree of curvature of the first curved area 100b after the 3D pasting process. Specifically, if the curvature of the arc surface formed by the first curved area 100b after the 3D pasting process is greater, the required elastic modulus of the first part 101a is smaller, and the required stretchability of the first part 101a is better; if the curvature of the arc surface formed by the first curved area 100b after the 3D pasting process is smaller, the required elastic modulus of the first part 101a is greater, and the required stretchability of the first part 101a is worse. Therefore, the elastic modulus of the first part 101a can be determined according to actual requirements, and correspondingly, the elastic modulus of the second part 101b can also be determined according to actual requirements. As in some embodiments of the present application, the elastic modulus of the first part 101a may be greater than or equal to 1 MPa and less than or equal to 20 MPa, and the elastic modulus of the second part 101b is greater than or equal to 1 GPa and less than or equal to 10 GPa, in order to meet the preparation requirements when the panel main body 102 of the display panel is attached to the curved cover plate 103.

In order to make that the local tensile deformation of the first part 101a can drive the part of the panel main body 102 corresponding to the first curved area 100b to closely attach to the curved cover plate 103 during the 3D pasting process, a maximum stretch rate of the first part 101a is greater than 50%.

Furthermore, since the curved direction of the second curved area 100c is simpler than that of the first curved area 100b after the display panel is processed by the 3D pasting process, the second part 101b may be deformed less than the local tensile deformation of the first part 101a or may be not deformed as conducting the 3D pasting process (i.e., the second part 101b can only meet the requirements of curved deformation when the display panel is subjected to the 3D pasting process), thus a maximum stretch rate of the second part 101b is less than 50%.

Please continue to refer to FIG. 1A to FIG. 1B and FIG. 2, since the arc surface formed by the first curved area 100b is curved in multiple directions, the arc formed by the second curved area 100c is only curved in a single direction, the display panel further comprises a transition area 100d to achieve a transitional change in the degree of curvature of the first curved area 100b and the second curved area 100c. The transition area 100d located between the first curved area 100b and the second curved area 100c. The support layer 101 comprises a third part 101c located in the transition area 100d. The elastic modulus of the third part 101c is greater than the elastic modulus of the first part 101a and is smaller than the elastic modulus of the second part 101b.

Optionally, the elastic modulus of the first part 101a may be greater than or equal to 1 MPa and less than or equal to 20 MPa, and the elastic modulus of the second part 101b is greater than or equal to 1 GPa and less than or equal to 10 GPa, and the elastic modulus of the third part 101c is greater than or equal to 2 MPa and less than or equal to 8 GPa. For example, the elastic modulus of the first part 101a may be equal to 1 MPa, 1.5 MPa, 2 MPa, 3 MPa, 5 MPa, 7 MPa, 10 MPa, 12 MPa, 15 MPa, 17 MPa, 18 MPa, 19 MPa, 19.5 MPa or 20 MPa. The elastic modulus of the second part 101b is equal to 1 GPa, 1.2 GPa, 1.5 GPa, 2 GPa, 2.5 GPa, 5 GPa, 7 GPa, 8 GPa, 8.5 GPa, 9 GPa, 9.7 GPa or 10 GPa; The elastic modulus of the third part 101c is equal to 2 MPa, 2.3 MPa, 5 MPa, 10 MPa, 20 MPa, 50 MPa, 100 MPa, 300 MPa, 700 MPa, 1 GPa, 1.1 GPa, 2 GPa, 2.3 GPa, 5 GPa, 7 GPa or 8 GPa.

Optionally, by controlling the preparation material of the support layer 101 corresponding to the transition area 100d, so that the elastic modulus of the third part 101c is greater than the elastic modulus of the first part 101a and is smaller than the elastic modulus of the second part 101b. Furthermore, as the first part 101a comprises a first base material 1011, the second part 101b comprises a second base material 1012, and an elastic modulus of the first base material 1011 is less than an elastic modulus of the second base material 1012, the third part 101c may comprise a mixture of the first base material 1011 and the second base material 1012, so that an elastic modulus of the third part 101c is greater than the elastic modulus of the first part 101a and is smaller than the elastic modulus of the second part 101b. Optionally, the first base material 1011 comprises polydimethylsiloxane or thermoplastic elastomer; the second base material 1012 comprises polyimide or polyethylene terephthalate.

In the mixture of the first base material 1011 and the second base material 1012 in the third part 101c, the proportions of the first base material 1011 and the second base material 1012 may be the same (i.e. the proportions of the first substrate 1011 and the second substrate 1012 may be both 50%), or may be different (such as, in the part of the transition area 100d close to the first curved area 100b, the proportion of the first base material 1011 is greater than the proportion of the second base material 1012 in the mixture of the first base material 1011 and the second base material 1012 in the third part 101c; in the part of the transition area 100d close to the second curved area 100b, the proportion of the first base material 1011 is smaller than the proportion of the second base material 1012 in the mixture of the first base material 1011 and the second base material 1012 in the third part 101c). In the mixture of the first base material 1011 and the second base material 1012 in the third part 101c, the first base material 1011 and the second base material 1012 can be uniformly mixed or non-uniformly mixed.

Optionally, in a direction from the first curved area 100b to the second curved area 100c, the elastic modulus of the third part 101c gradually increases, so that in a direction from the second curved area 100c to the first curved area 100b, the third part 101c possesses better and better stretchability, thus to achieve a transitional change in the elastic modulus of the first part 101a and the second part 101b, to ensure that the part of the panel main body 102 corresponding to the transition area 100d and the curved cover plate 103 are closely attached to each other as conducting the 3D pasting process.

The mixing ratio of the first base material 1011 and the second base material 1012 in the third part 101c in the direction from the first curved area 100b to the second curved area 100c can be controlled, to achieve that the elastic modulus of the third part 101c gradually increases in the direction from the first curved area 100b to the second curved area 100c. Specifically, in the direction from the first curved area 100b to the second curved area 100c, the proportion of the second base material 1012 gradually increases in the mixture of the first base material 1011 and the second base material 1012 in the third part 101c; correspondingly, the proportion of the first base material 1011 gradually decreases in the mixture of the first base material 1011 and the second base material 1012 in the third part 101c, to achieve that the elastic modulus of the third part 101c gradually increases in the direction from the first curved area 100b to the second curved area 100c. For example, in the part of the transition area 100d close to the first curved area 100b, the ratio of the first base material 1011 and the second base material 1012 is greater than 1:1 in the mixture of the first base material 1011 and the second base material 1012 in the third part 101c; in the part of the transition area 100d close to the second curved area 100c, the ratio of the first base material 1011 and the second base material 1012 is smaller than 1:1 in the mixture of the first base material 1011 and the second base material 1012 in the third part 101c.

Optionally, the first curved area 100b, the second curved area 100c and the transition area 100d may be subjected to a simulation analysis on the curvature required after the 3D pasting process is processed to obtain the ratio of the first base material 1011 and the second base material 1012, so that the elastic modulus of the third part 101c gradually increases in the direction from the first curved area 100b to the second curved area 100c.

Specifically, a single homogeneous material may be employed to form the support layer 101 (for example, the first base material 1011 is employed to form the support layer 101), then the molding simulation is performed to the support layer 101 formed of the single homogeneous material (the curvatures of the first curved area 100*b*, the second curved area 100*c* and the transition area 100*d* can be determined by a profiling jig), so that the first curved area 100*b*, the second curved area 100*c* and the transition area 100*d* are all in the curved states according to the required arc surfaces; then, the simulation result is outputted (stress and strain cloud diagrams of the plane area 100*a*, the first curved area 100*b*, the second curved area 100*c* and the transition area 100*d*, etc. are outputted); then the input values of the elastic modulus of the materials employed in the first curved area 100*b*, the second curved area 100*c*, and the transition area 100*d* are adjusted as required according to the outputted simulation result to optimize the simulation model; and then, the simulating calculation is performed again. The simulation analysis is performed in turn until the elastic modulus distributions corresponding to the required curvatures of the first curved area 100*b*, the second curved area 100*c* and the transition area 100*d* are obtained; finally, the ratios of the first base material 1011 and the second base material 1012 in different areas can be obtained according to the obtained distribution of the elastic modulus.

It can be understood that according to the different curvatures required for the first curved area 100*b*, the second curved area 100*c* and the transition area 100*d* after the 3D pasting process, the elastic modulus distributions corresponding to the required curvatures of the first curved area 100*b*, the second curved area 100*c* and the transition area 100*d* obtained by the simulation analysis are also different. Thus, the obtained ratios of the first base material 1011 and the second base material 1012 are also different. Therefore, the ratio of the first base material 1011 and the second base material 1012 can be determined according to actual requirements, and will not be repeated here.

Optionally, respective parts of the support layer 101 can be tested by a dedicated Young's modulus tester to verify whether the elastic modulus of the proportions of different first base materials 1011 and different second base materials 1012 in the support layer 101 meet the requirements.

Optionally, the support layer 101 may comprise the third part 101*c* possessing different ratios of the first base material 1011 and the second base material 1012 by utilizing by chemical co-precipitation method, sol-gel method, hydrothermal (solvothermal) synthesis method, inkjet printing method, etc.

Correspondingly, as conducting the 3D pasting process, the first part 101*a* and the third part 101*c* can have greater tensile deformation and the second part 101*b* can be slightly stretched or not deformed, and the maximum stretch rate of the third part 101*c* may be between the maximum stretch rate of the first part 101*a* and the maximum stretch rate of the second part 101*b*. Furthermore, the maximum stretch rate of the third part 101*c* may be less than the maximum stretch rate of the first part 101*a*, and greater than the maximum stretch rate of the second part 101*b*. Thus, during the 3D pasting process, the local tensile deformation of the third part 101*c* is smaller than the local tensile deformation of the first part 101*a*, and the tensile deformation of the second part 101*b* is smaller than the tensile deformation of the third part 101*c*. Furthermore, in the direction from the first curved area 100*b* to the second curved area 100*c*, the stretchabilities of the third part 101*c* at respective positions are different. Specifically, in the direction from the first curved area 100*b* to the second curved area 100*c*, the stretchability of the third part 101*c* gradually increases.

Please continue to refer to FIG. 1A to FIG. 1B and FIG. 2, the support layer 101 further comprises a fourth part located in the plane area 100*a*, and the elastic modulus of the second part 101*b* is less than or equal to an elastic modulus of the fourth part. Namely, the second part 101*b* may be stretched and deformed during the 3D pasting process, or may not be stretched and deformed, but only curved and deformed; the fourth part may not be stretched and deformed during the 3D pasting process.

Before the 3D pasting process, the fourth part can be kept straight. After the 3D pasting process, the part of the panel main body 102 corresponding to the fourth part is kept in a straight state along with the fourth part.

Optionally, the display panel further comprises a plane transition area between the first curved area 100*b* and the plane area 100*a*, and the support layer 101 further comprises a fifth part located in the plane transition area. An elastic modulus of the fifth part is smaller than the elastic modulus of the fourth part, and is greater than the elastic modulus of the first part 101*a*. Optionally, the elastic modulus of the fifth part is equal to the elastic modulus of the third part 101*c*.

Furthermore, in a direction from the first curved area 100*b* to the plane area 100*a*, the elastic modulus of the fifth part gradually increases, to achieve a transitional change in the elastic modulus of the first part 101*a* to the fourth part. Then, as conducting the 3D pasting process, the tensile deformation of the support layer 101 in the direction from the first curved area 100*b* to the plane area 100*a* continuously decreases, so as to drive the panel main body 102 to closely attach to curved cover plate 103.

Figure 3A:
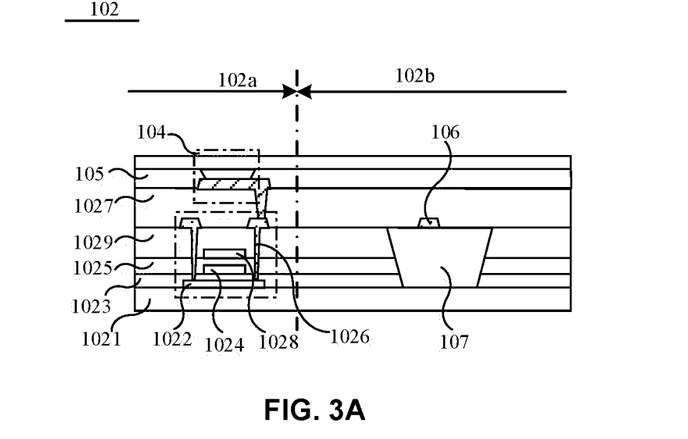
FIG. 3A and FIG. 3B are schematic structural diagrams of a panel main body provided by an embodiment of the present application.
Figure 3B:
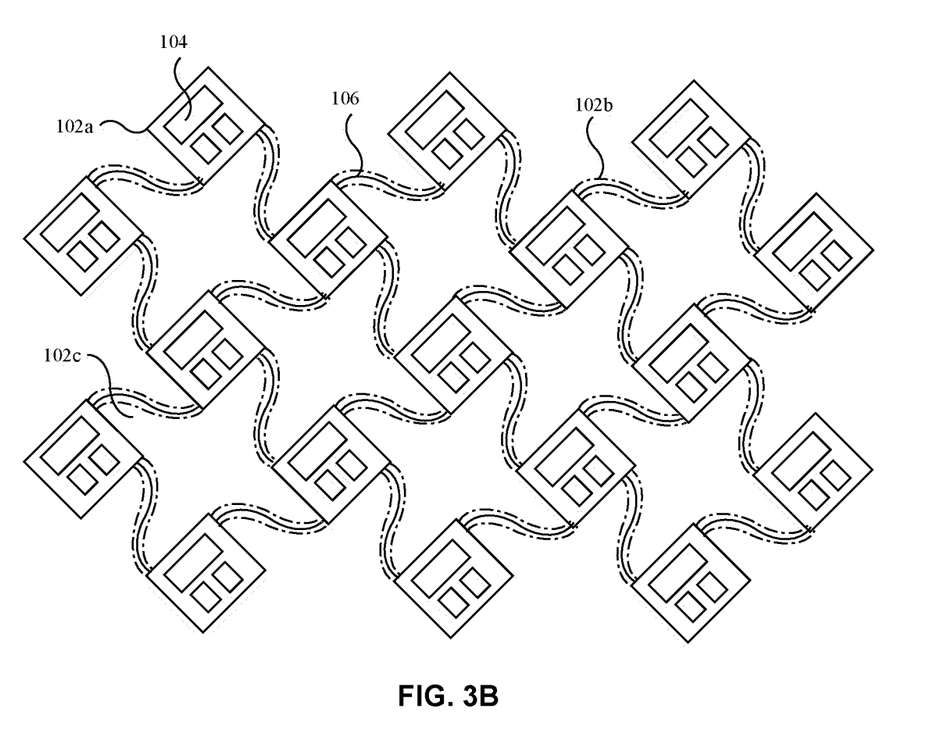

As shown in FIG. 3A and FIG. 3B, these are schematic structural diagrams of a panel main body provided by an embodiment of the present application. The panel main body 102 comprises an array substrate.

The array substrate comprises a base substrate 1021 on the support layer 101 and a driving array layer on the base substrate 1021. Optionally, the base substrate 1021 comprises a flexible base substrate, the preparation material of the base substrate 1021 comprises polyimide or a plastic flexible material, and the support layer 101 is employed to support the base substrate 1021. The driving array layer comprises a plurality of pixel driving circuits, and each of the pixel driving circuits comprises a plurality of transistors and connecting wires electrically connected to the transistors. Optionally, each of the pixel driving circuits may adopt a structure, such as 2T1C, 7T1C, 7T2C, and etc.

Optionally, the driving array layer comprises an active layer 1022 on the base substrate 1021, a first insulating layer 1023 covering the active layer 1022, a first metal layer 1024 disposed on the first insulating layer 1023, a second insulating layer 1025 covering the first metal layer 1024, a second metal layer 1026 disposed on the second insulating layer 1025 and a planarization layer 1027 covering the second metal layer 1026. The first metal layer 1024 comprises a gate disposed in alignment with the active layer 1022, and the second metal layer 1026 comprises a source and a drain electrically connected to the active layer 1022.

Furthermore, if the pixel driving circuit adopts a 7T1C structure, the driving array layer further comprises a third metal layer 1028 disposed on the second insulating layer 1025 and an interlayer dielectric layer 1029 covering the third metal layer 1028. The second metal layer 1026 is disposed between the interlayer dielectric layer 1029 and the planarization layer 1027. The pixel driving circuit comprises a first transistor, and the first metal layer 1024 comprises a gate of the first transistor, and the third metal layer 1028 comprises an electrode part corresponding to the gate of the first transistor. The gate and the electrode part of the first transistor respectively form a lower plate and an upper plate of the capacitor C.

Optionally, the array substrate comprises a low-temperature polysilicon array substrate or a low-temperature polycrystalline oxide array substrate. Namely, the active layers of the plurality of transistors may all comprise silicon semiconductor materials, or the active layers of some of the transistors of the plurality of transistors may comprise silicon semiconductor materials, and the active layers of the other transistors may comprise oxide semiconductor materials.

Optionally, the display panel comprises a passive light emitting display panel or an active light emitting display panel. Further, the passive light emitting display panel comprises a liquid crystal display panel, and the panel main body 102 further comprises a color filter substrate and liquid crystal molecules located between the array substrate and the color filter substrate. The array substrate comprises pixel electrodes, and the color filter substrate comprises a plurality of color filter units. Furthermore, the liquid crystal display panel further comprises a common electrode and a backlight source for providing a backlight for the panel main body 102. The common electrode is located on the array substrate or on the color filter substrate. Optionally, in order to prevent the backlight effect provided by the backlight source to the panel main body 102 from being affected by the support layer 101, the backlight source may be located between the panel main body 102 and the support layer 101.

Optionally, the color filter unit comprises a perovskite material, a fluorescent material or a quantum dot material.

Please continue to refer to FIG. 3A to FIG. 3B. The display panel is an active light emitting display panel, and the panel main body 102 further comprises a light emitting device 104 electrically connected to the pixel driving circuit. The light emitting device 104 comprises an organic light emitting diode, a mini light emitting diode or a micro light emitting diode.

One pixel driving circuit can drive at least one light emitting device 104 to emit light. Furthermore, a light emitting device 104 located in the plane area 100a is driven to emit light by a pixel driving circuit. A plurality of light emitting devices located in the first curved area 100b and/or in the second curved area 100c close to the non-display area of the display panel can be driven by one pixel driving circuit to emit light to reduce the arrangement density of the pixel driving circuits located in the first curved area 100b and/or in the second curved area 100c. The non-display area is located at the periphery of the first curved area 100b and the second curved area 100c.

Furthermore, the light emitting device 104 comprises an anode, a cathode and a light emitting layer located between the anode and the cathode. The panel main body 102 further comprises a pixel definition layer 105, and the light emitting layer is located in a pixel definition area of the pixel definition layer 105. Optionally, the light emitting device 104 is an inverted organic light emitting diode or a non-inverted light emitting diode. Optionally, the light emitting layer comprises a perovskite material, a fluorescent material or a quantum dot material.

Please continue to refer to FIG. 3B. The panel main body 102 comprises a plurality of island-shaped areas 102a, a hinge area 102b and a middle area 102c that are separated from each other. The hinge area 102b is connected to a plurality of the island-shaped areas 102a, and the middle area 102c is surrounded by the hinge area 102b and the island-shaped area 102a. The panel main body 102 comprises a plurality of display units and a connecting unit 106, and each of the display units is located in the island-shaped area 102a, and each of the display units comprises a plurality of the light emitting devices 104; The connecting unit 106 connects a plurality of the display units, and the connecting unit 106 is correspondingly located in the hinge area 102b.

Moreover, the connecting unit 106 is in the same layer as the source and the drain. In a top view, the connecting unit 106 is wave-shaped or arc-shaped, so that when the display panel is subjected to the 3D pasting process, the part of the panel main body 102 corresponding to the first part 101a and the third part 101c possesses certain stretchability.

The array substrate comprises an organic polymer material in the middle area 102c. Specifically, in the manufacturing process of the display panel, by removing the first insulating layer 1023, the second insulating layer 1025 and the interlayer dielectric layer 1029 located in the middle area 102c, and then filling the middle area 102c with an organic polymer material, so that the array substrate comprises the organic polymer material in the middle area 102c. Optionally, the organic polymer material comprises polydimethylsiloxane.

The array substrate comprises an organic filling layer 107 located in the hinge area 102b. Specifically, in the manufacturing process of the display panel, by removing the first insulating layer 1023, the second insulating layer 1025 and the interlayer dielectric layer 1029 located in the hinge area 102b, and then filling the hinge area 102b with an organic filling layer 107, so that the connecting unit 106 is located on the organic filling layer 107; the organic filling layer 107 is employed to reduce the curving stress.

Optionally, since the support layer 101 is located under the base substrate 1021, the base substrate 1021 may also adopt a patterned design. Specifically, the base substrate 1021 is only located in the island-shaped area 102a. The organic polymer material is located in the via hole that penetrates the base substrate 1021, the first insulating layer 1023, the second insulating layer 1025 and the interlayer dielectric layer 1029 in the middle area 102c. The organic filling layer 107 is located in the via hole that penetrates the base substrate 1021, the first insulating layer 1023, the second insulating layer 1025 and the interlayer dielectric layer 1029 in the hinge area 102b. Then, while the influence of the base substrate 1021 on the curving performance and stretchability of the panel main body 102 is reduced, the support layer 101 provides a complete support for the panel main body 102.

It can be understood that the display panel further comprises a polarizer, touch electrodes and other parts not shown. Optionally, the touch electrodes may be combined with the panel main body 102 in an in-cell or out-cell manner, and the display panel may be implemented in a self-capacitive touch mode, a mutual-capacitive touch mode or a self-capacitive touch mode to realize the touch function.

It can be understood that the display panel further comprises a source driving chip, a gate driving chip, data lines, scan lines and other parts that are not shown. Optionally, the source driving chip and the gate driving chip are located in the non-display area of the display panel, and the gate driving chip is electrically connected to the pixel driving circuit through the scan line to provide a scan signal Scan and a light emission control signal EM for the pixel driving circuit; The source driving chip is electrically connected to the pixel driving circuit through the data line to provide the pixel driving circuit with gray-scale voltages for enabling the light emitting device 104 to have different light emitting brightness.

The present application further provides a display device. The display device comprises any one of the aforesaid display panels.

The display devices comprise fixed terminals (such as TVs, desktop computers, etc.), mobile terminals (such as mobile phones, notebooks, etc.), and wearable devices (such as bracelets, virtual display devices, enhanced display devices, etc.).

The principles and implementations of the present application have been described with reference to specific illustrations. The description of the foregoing embodiments is merely for helping to understand the technical solutions of the present application and the core ideas thereof; meanwhile, those skilled in the art will be able to change the specific embodiments and the scope of the application according to the idea of the present application. In conclusion, the content of the specification should not be construed as limiting the present application.

What is claimed is:

1. A display panel, comprising a plane area, a first curved area and two second curved areas, wherein the plane area comprises a first side and a second side adjacent to the first side, and the two second curved areas are respectively connected to the first side and the second side, and the first curved area is located between the two second curved areas and corresponds to a corner of the plane area; the display panel comprises:
   a support layer, comprising a curved first part located in the first curved area and a curved second part located in the second curved area; and
   a panel main body, located on the support layer and curved along with the first part and the second part;
   wherein an elastic modulus of the first part is smaller than an elastic modulus of the second part;
   wherein the display panel further comprises a transition area located between the first curved area and the second curved area, and the support layer comprises a curved third part located in the transition area; wherein an elastic modulus of the third part is greater than the elastic modulus of the first part and is smaller than the elastic modulus of the second part; and
   wherein the first part comprises a first base material, the second part comprises a second base material, and the third part comprises a mixture of the first base material and the second base material; wherein an elastic modulus of the first base material is less than an elastic modulus of the second base material.

2. The display panel according to claim 1, wherein in a direction from the first curved area to the second curved area, the elastic modulus of the third part gradually increases.

3. The display panel according to claim 1, wherein in a direction from the first curved area to the second curved area, a proportion of the second base material gradually increases.

4. The display panel according to claim 3, wherein the first base material comprises polydimethylsiloxane or thermoplastic elastomer, the second base material comprises polyimide or polyethylene terephthalate.

5. The display panel according to claim 1, wherein the elastic modulus of the first part is greater than or equal to 1 MPa and less than or equal to 20 MPa, and the elastic modulus of the second part is greater than or equal to 1 GPa and less than or equal to 10 GPa.

6. The display panel according to claim 1, wherein the support layer further comprises a fourth part located in the plane area, and the elastic modulus of the second part is less than or equal to an elastic modulus of the fourth part.

7. The display panel according to claim 6, wherein the display panel further comprises a plane transition area between the first curved area and the plane area, and the support layer further comprises a fifth part located in the plane transition area; wherein an elastic modulus of the fifth part is smaller than the elastic modulus of the fourth part, and is greater than the elastic modulus of the first part.

8. The display panel according to claim 7, wherein the elastic modulus of the fifth part is equal to the elastic modulus of the third part.

9. The display panel according to claim 7, wherein in a direction from the first curved area to the plane area, the elastic modulus of the fifth part gradually increases.

10. The display panel according to claim 1, wherein the panel main body comprises a substrate, a driving array layer and a light emitting device; the substrate is located on the support layer, the driving array layer is located on the substrate, and the light emitting device is located on the driving array layer.

11. The display panel according to claim 10, wherein the light emitting device comprises an organic light emitting diode, a mini light emitting diode or a micro light emitting diode.

12. A display device, comprising a display panel, wherein the display panel comprises a plane area, a first curved area and two second curved areas, wherein the plane area comprises a first side and a second side adjacent to the first side, and the two second curved areas are respectively connected to the first side and the second side, and the first curved area is located between the two second curved areas and corresponds to a corner of the plane area; the display panel comprises:
   a support layer, comprising a curved first part located in the first curved area and a curved second part located in the second curved area; and
   a panel main body, located on the support layer and curved along with the first part and the second part;
   wherein an elastic modulus of the first part is smaller than an elastic modulus of the second part;
   wherein the display panel further comprises a transition area located between the first curved area and the second curved area, and the support layer comprises a curved third part located in the transition area; wherein an elastic modulus of the third part is greater than the elastic modulus of the first part and is smaller than the elastic modulus of the second part; and
   wherein the first part comprises a first base material, the second part comprises a second base material, and the third part comprises a mixture of the first base material and the second base material; wherein an elastic modulus of the first base material is less than an elastic modulus of the second base material.

13. The display device according to claim 12, wherein in a direction from the first curved area to the second curved area, the elastic modulus of the third part gradually increases.

14. The display device according to claim 12, wherein in a direction from the first curved area to the second curved area, a proportion of the second base material gradually increases.

* * * * *